United States Patent [19]
Hozumi et al.

[11] Patent Number: 5,672,463
[45] Date of Patent: Sep. 30, 1997

[54] POLYFUNCTIONAL VINYL ETHER COMPOUND AND PHOTORESIST RESIN COMPOSITION CONTAINING THE SAME

[75] Inventors: Shigeo Hozumi; Shinichiro Kitayama; Hiroya Nakagawa, all of Ibaraki, Japan

[73] Assignee: Sumitomo Chemical Company, Limited, Osaka, Japan

[21] Appl. No.: 546,131

[22] Filed: Oct. 20, 1995

Related U.S. Application Data

[62] Division of Ser. No. 197,306, Feb. 16, 1994, Pat. No. 5,510,540.

[30] Foreign Application Priority Data

| Feb. 16, 1993 | [JP] | Japan | 5-26570 |
| Aug. 2, 1993 | [JP] | Japan | 5-191249 |
| Aug. 6, 1993 | [JP] | Japan | 5-196036 |
| Aug. 23, 1993 | [JP] | Japan | 5-207497 |

[51] Int. Cl.$^6$ .......................... G03C 1/73; G03F 7/027; C08F 2/46

[52] U.S. Cl. .......... 430/281.1; 430/171; 430/176; 430/287.1; 430/288.1; 522/149; 522/166; 522/181

[58] Field of Search .................. 430/171, 176, 430/281.1, 287.1, 288.1; 522/149, 166, 181

[56] References Cited

U.S. PATENT DOCUMENTS

| 4,388,450 | 6/1983 | Criuello | 525/502 |
| 4,707,558 | 11/1987 | Wang et al. | 568/23 |
| 4,978,810 | 12/1990 | Kanayama et al. | 568/720 |
| 4,994,346 | 2/1991 | Meir et al. | 430/280.1 |
| 5,004,842 | 4/1991 | Klemarczyk et al. | 568/640 |
| 5,069,997 | 12/1991 | Schwalm et al. | 430/270.1 |
| 5,070,117 | 12/1991 | Klemarczyk et al. | 522/31 |
| 5,079,129 | 1/1992 | Roth et al. | 430/280.1 |
| 5,362,822 | 11/1994 | Hefner | 525/523 |

FOREIGN PATENT DOCUMENTS

| 0302019 | 2/1989 | European Pat. Off. |
| 2501697 | 9/1982 | France . |
| 3260651 | 11/1991 | Japan | 430/287.1 |

OTHER PUBLICATIONS

English Translation of JP3–260641, Nov. 20, 1991 Matsumura et al.

Database WPI, Section Ch., Week 8519, Derwent Publication, AN 85–112778.

Reichmanis et al., Chemical Amplification Mechanisms for Microlithography, Chemistry of Materials 3, 1991. pp. 394–407.

JP 60–71657 English Translation, Apr. 23, 1985.

Primary Examiner—George F. Lesmes
Assistant Examiner—Bernard P. Codd
Attorney, Agent, or Firm—Sughrue, Mion, Zinn, Macpeak & Seas, PLLC

[57] ABSTRACT

A polyfunctional vinyl ether compound represented by formula (I):

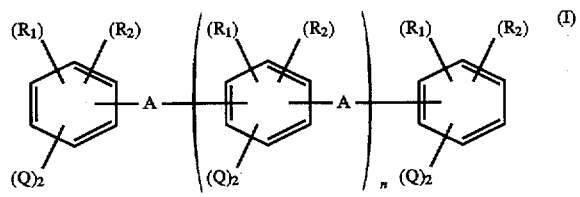

wherein n, which is an average repeating number, represents a number of from 0 to 20; $R_1$ and $R_2$ each independently represents a hydrogen atom, a halogen atom, an alkyl group, an aryl group, an aralkyl group, an alkoxy group, an aryloxy group, or a cycloalkyl group; Q each independently represents —OH or a group represented by the formula —OROCH=CH$_2$, wherein R represents an alkylene group having from 1 to 12 carbon atoms, the molar ratio of (—OH)/(—OROCH=CH$_2$) being from 10/90 to 90/10; and A each independently represents a divalent hydrocarbon group having from 1 to 30 carbon atoms.

18 Claims, No Drawings

POLYFUNCTIONAL VINYL ETHER COMPOUND AND PHOTORESIST RESIN COMPOSITION CONTAINING THE SAME

This is a divisional of application Ser. No. 197,306 filed Feb. 16, 1994 now U.S. Pat. No. 5,510,540.

FIELD OF THE INVENTION

The present invention relates to a polyfunctional vinyl ether compound and a photoresist resin composition containing the vinyl ether compound.

BACKGROUND OF THE INVENTION

As a photopolymerizable monomer for a negative working photoresist, acrylate resins such as a polyfunctional epoxy acrylate and a polyfunctional acrylate, and epoxy resins are known.

As a resin composition for a positive working photoresist, a combination of a novolac resin and quinonediazide compound is known and has been widely used.

As a negative working photoresist resin composition containing a photopolymerizable monomer having a vinyloxyalkyl group, compositions described in JP-A-60-7165, JP-A-63-71840, and JP-A-64-88538 (the term "JP-A" as used herein means a "unexamined published Japanese patent application") are known. The photopolymerizable monomers having a vinyloxyalkyl group shown in these publications are all vinyloxyalylated products of a novolac obtained by condensing a monohydric phenol such as phenol and cresol, and an aldehyde, e.g., formalin, and are different from the photopolymerizable monomer used in the present invention described hereinafter.

The conventional negative working photoresist using an acrylate resin as a photopolymerizable monomer encounters a problem in that the occurrence of polymerization hindrance with oxygen on hardening of the photoresist is inevitable, and therefore the hardenability of the surface of the hardening film is insufficient. Thus, the photoresist is required to be handled carefully on hardening, such that nitrogen purging is applied, the surface of the photoresist film is overcoated with an oxygen intercepting layer and the like.

In the case of a negative working photoresist resin composition utilizing the photo ring-opening polymerization of an epoxy group which does not cause a polymerization hindrance with oxygen, the composition has another problem in that the hardening rate is slower than that of the acrylate resin composition.

Thus, the foregoing photoresist resin compositions do not sufficiently meet the characteristics required as the resin composition for a photoresist.

In the case of the resin compositions each having, as a photopolymerizable monomer, the foregoing vinyloxyalkylated product of novolac obtained by condensing a monohydric phenol and an aldehyde such as formalin disclosed in JP-A-60-7165, JP-A-63-71840, and JP-A-64-88538 described above, it is difficult to simultaneously obtain a high sensitivity and a developability with an aqueous diluted alkali solution, because of a small content of a phenolic hydroxy group in the monomer molecule.

SUMMARY OF THE INVENTION

An object of the present invention is, therefore, to provide a polyfunctional vinyl ether compound and a photoresist composition containing the vinyl ether compound as the main component. The photoresist composition has a good surface hardening property that the polymerization thereof is not hindered with oxygen, with maintaining the quick hardening property and the properties of the hardened product thereof same as those of a conventional acrylate resin. The photoresis composition also has excellent photoresist characteristics such as a high sensitivity, a high resolution, a developability with an aqueous diluted alkali solution, etc.

Other objects and effects of the present invention will be apparent from the following description.

As the result of various investigations for solving the prior art problems, the inventors have discovered that the a photoresist comprising specific components satisfies the foregoing objects and have succeeded in accomplishing the present invention.

The present invention relates to, as a first aspect, a polyfunctional vinyl ether compound represented by formula (I):

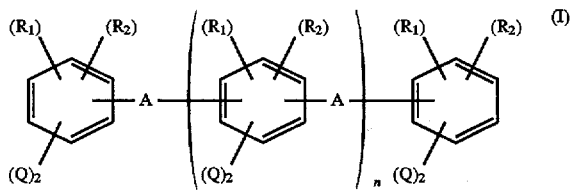

wherein n, which is an average repeating number, represents a number of from 0 to 20; $R_1$ and $R_2$ each independently represents a hydrogen atom, a halogen atom, an alkyl group, an aryl group, an aralkyl group, an alkoxy group, an aryloxy group, or a cycloalkyl group; Q each independently represents —OH or a group represented by the formula —OROCH=$CH_2$, wherein R represents an alkylene group having from 1 to 12 carbon atoms, the molar ratio of (—OH)/(—OROCH=$CH_2$) being from 10/90 to 90/10; A each independently represents a divalent hydrocarbon group having from 1 to 30 carbon atoms.

The present invention also relates to, as a second aspect, a polyfunctional vinyl ether compound represented by formula (I) described above, wherein from 0.1 to 60 mol% of each of groups represented by formulae (II) and (III) in formula (I):

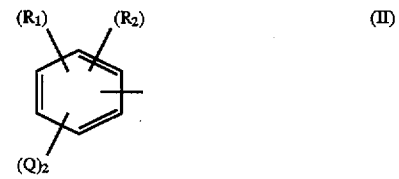

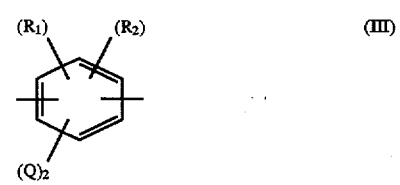

wherein $R_1$, $R_2$, and Q have the same meaning as those in formula (I), is replaced with each of groups represented by formulae (IV) and (V), respectively:

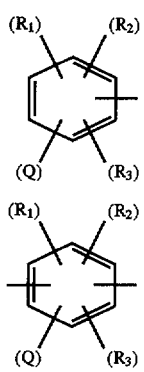

wherein $R_1$, $R_2$, and Q have the same meaning as those in formula (I) described above; and $R_3$ has the same meaning as $R_1$ and $R_2$.

The present invention also relates to, as a third aspect, a polyfunctional vinyl ether compound represented by formula (VI):

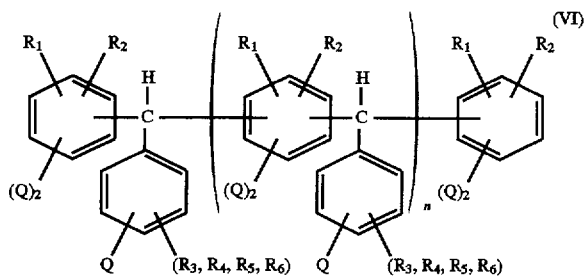

wherein n, which is an average repeating number, represents a number of from 0 to 20; $R_1$, $R_2$, $R_3$, $R_4$, $R_5$, and $R_6$ each independently represents a hydrogen atom, a halogen atom, an alkyl group, an aryl group, an aralkyl group, an alkoxy group, an aryloxy group, or a cycloalkyl group, where each of $R_3$, $R_4$, $R_5$, and $R_6$ is bonded to the benzene nucleus; and Q each independently represents —OH or a group represented by the formula —OROCH=$CH_2$, wherein R represents an alkylene group having from 1 to 12 carbon atoms, the molar ratio of (—OH)/(—OROCH=$CH_2$) being from 10/90 to 90/10.

The present invention also relates to, as a fourth aspect, a negative working photoresist resin composition comprising:
(1) a polyfunctional vinyl ether compound (as a photosensitive resin) represented by formula (I) described above;
(2) at least one kind of a cationic photopolymerization initiator; and
(3) a solvent.

The present invention also relates to, as a fifth aspect, a negative working photoresist resin composition comprising:
(1) a polyfunctional vinyl ether compound (as a photosensitive resin) of the second aspect of the present invention described above;
(2) at least one kind of a cationic photopolymerization initiator; and
(3) a solvent.

The present invention also relates to, as a sixth aspect, a photoresist resin composition comprising:
(1) a polyfunctional vinyl ether compound (as a photosensitive resin) represented by formula (VI) described above;
(2) at least one kind of cationic photopolymerization initiators; and
(3) a solvent.

DETAILED DESCRIPTION OF THE INVENTION

In formulae (I) to (V) described above, $R_1$, $R_2$, and $R_3$ each independently represents a hydrogen atom; a halogen atom such as a fluorine atom, a chlorine atom, a bromine atom, etc.; an alkyl group such as a methyl group, an ethyl group, a propyl group, a butyl group, an octyl group, etc.; an aryl group such as a phenyl group, a tolyl group, a naphthyl group, etc.; an aralkyl group such as a phenethyl group, a benzhydryl group, etc.; an alkoxy group such as an ethoxy group, a propoxy group, etc.; an aryloxy group such as a phenoxy group, a naphthoxy group, an anthroxy group, etc.; or a cycloalkyl group such as a cyclopentyl group, a cyclohexyl group, etc. Among these, a hydrogen atom, a methyl group, a t-butyl group, a t-octyl group, and a bromine atom are preferred.

In formulae (I) to (V), Q each independently represents —OH or a group shown by the formula —OROCH=$CH_2$, wherein R represents an alkylene group having from 1 to 12 carbon atoms. The molar ratio of (—OH)/(—OROCH=$CH_2$) is in the range of from 10/90 to 90/10, and preferably from 30/70 to 70/30.

In formula (I), A represents a divalent hydrocarbon group having from 1 to 30 carbon atoms. Examples thereof include an alkylene group such as a methylene group, an ethylene group, an isopropylidene group, a butylene group, an ethylmethylene group, a 2-ethylpentylmethylene group, etc.; a cycloalkylene group such as a cyclohexylidene group, a cyclooctylidene group, a dicyclopentylene group, etc.; an arylene group such as a 1,3-benzenedimethylene group, a phenylmethylene group, a 1,4-benzenedimethylene group, a 2,2-bis(4-phenylene)propane group, a 4-methoxyphenylmethylene group, a bis(4-phenylene) methane group, a 4,4-diphenyldimethylethane group, etc.; and groups having a cyclic terpene skeleton such as limonene, dipentyne, terpinolene, pinene, etc. Among these, a methylene group, an isopropylidene group, a cyclohexylidene group, and a dicyclopentylene group are preferred.

In formula (I), n is an average repeating number and represents a number of from 0 to 20, and preferably from 0 to 10. If n is over 20, the solubility of the compound in a solvent is undesirably lowered.

In the polyfunctional vinyl ether compound of the present invention having the groups shown by formulae (IV) and (V), the content of each group is preferably from 0.1 to 60 mol %. If the content of the group is less than 0.1 mol %, the effects of these groups (controlling a solubility, adhesive property, etc.) tend to be reduced, and if the content thereof is over 60 mol %, the number of the functional groups Q of the whole compound becomes small and when the compound is used for a negative working photoresist for example, the sensitivity and the developability with an aqueous diluted alkali solution tends to be reduced.

A synthetic method for the compound of formula (I) is described below but is not construed as being limited thereto.

The compound of formula (I) can be obtained by contacting a compound ($S_1$) represented by formula (VII):

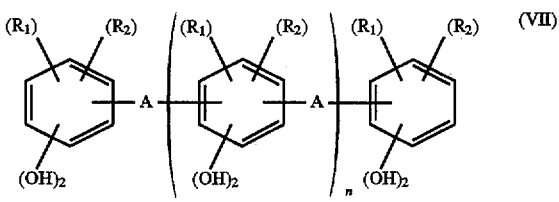

wherein n, $R_1$, $R_2$, and A have the same meaning as those of formula (I), or a compound ($S_2$) shown by formula (VII) wherein from 0.1 to 60 mol % of each of the groups represented by the formulae (VIII) and (IX):

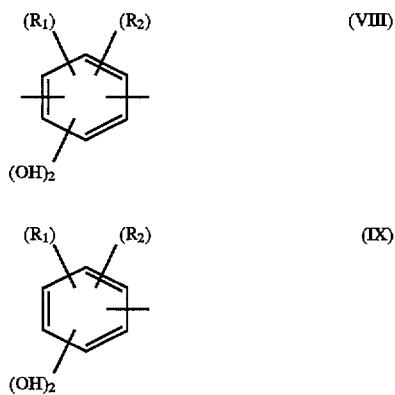

wherein $R_1$ and $R_2$ are same as those in the formula (I), is replaced with each of the groups represented by formulae (X) and (XI), respectively:

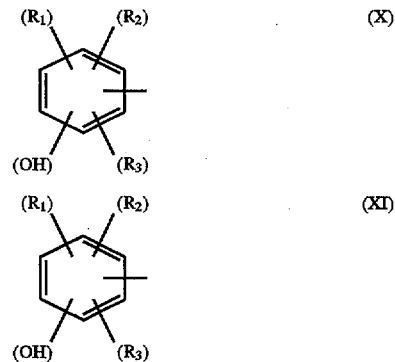

wherein $R_1$ and $R_2$ are same as those in formula (I) and $R_3$ has the same meaning as $R_1$ and $R_2$, with a haloalkyl vinyl ether (T) represented by the formula $XROCH=CH_2$, wherein X represents a halogen atom and R represents an alkylene group having from 1 to 12 carbon atoms.

The compound ($S_1$) shown by formula (VII) is a known compound and can be generally obtained by the reaction of a polyhydric phenol and an aldehyde, a ketone, or a diene. Examples of the polyhydric phenol used in the foregoing reaction include resorcinol, hydroquinone, methylhydroquinone, and catechol. Examples of the aldehyde include formaldehyde, acetaldehyde, n-butylaldehyde, and benzaldehyde. Examples of the ketone include cyclohexanone, and cylooctanone. Examples of the diene include dicyclopentadiene.

The compound ($S_2$) described above is a known compound and can be generally obtained by reacting a polyhydric phenol and a monohydric phenol with an aldehyde, a ketone, or a diene.

Examples of the monohydric phenol used in the foregoing reaction include phenol, o-, m-, or p-cresol, 2,6-xylenol, and p-t-octylphenol. Examples of the polyhydric phenol, the aldehyde, the ketone, and the diene include those exemplified above in the case of producing the compound ($S_1$).

Examples of the haloalkyl vinyl ether (T) include 2-chloroethyl vinyl ether.

On the foregoing reaction, the reaction rate can be accelerated by adding a proper base as a condensing agent, e.g., anhydrous sodium carbonate; potassium carbonate; metallic sodium; an alkali metal alcoholate such as sodium methylate, etc.; a quaternary ammonium salt such as triethylbenzylammonium chloride, tetraethylammonium chloride, tributylbenzylammonium chloride, etc.; a base such as sodium hydroxide, potassium hydroxide, etc., to the reaction system.

In the case of using the base as a condensing agent described above, its charged amount is generally from 0.1 to 10.0 mols, and preferably from 0.3 to 2.0 mols, per 1.0 mol equivalent of the OH group of the compound (S) or ($S_2$), so as to obtain a high reaction accelerating effect.

The reaction can be carried out in an inert solvent such as ethyl cellosolve, dimethyl sulfoxide, ethylene glycol monomethyl ether, dimethyl acetamide, etc. There is no particular restriction on the reaction temperature but a temperature in the range of from room temperature to 100° C. is preferred.

For isolating and purifying the desired product after finishing the foregoing reaction, any known method can be employed. For example, after cooling the reaction mixture to room temperature, the organic layer is extracted with toluene or methyl isobutyl ketone, the extract is washed several times with water to remove the unreacted compound ($S_1$) or ($S_2$) and inorganic slats, and after drying the organic layer with a drying agent such as anhydrous sodium sulfate, etc., the dried organic layer was concentrated under reduced pressure to provide the desired product. The method is not limited to the above.

In formula (VI) described above, $R_1$, $R_2$, $R_3$, $R_4$, $R_5$, and $R_6$ each independently represents a hydrogen atom; a halogen atom such as a fluorine atom, a chlorine atom, a bromine atom, etc.; an alkyl group such as a methyl group, an ethyl group, a propyl group, a butyl group, etc.; an aryl group such as a phenyl group, a tolyl group, a naphthyl group, etc.; an aralkyl group such as a benzyl group, a phenethyl group, a benzhydryl group, etc.; an alkoxy group such as a methoxy group, an ethoxy group, a propoxy group, etc.; an aryloxy group such as a phenoxy group, a naphthoxy group, an anthroxy group, etc.; or a cycloalkyl group such as a cyclopentyl group, a cyclohexyl group, etc.

In formula (VI), Q each independently represents —OH or —OROCH=$CH_2$, wherein R represents an alkylene group having from 1 to 12 carbon atoms. The molar ratio of (—OH)/(—OROCH=$CH_2$) is in the range of from 10/90 to 90/10, and preferably from 30/70 to 70/30.

In formula (VI), n is an average repeating number and represents a number of from 0 to 20, and preferably from 0 to 10. If the value of n is over 20, the solubility of the compound in the solvent is not undesirably lowered.

A synthesis method of the compound of formula (VI) is described below but it is not construed as being limited thereto.

The compound of formula (VI) can be obtained by contacting a compound (S) represented by formula (XII):

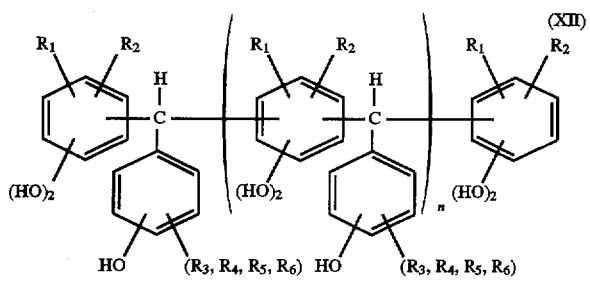

(XII)

wherein n, $R_1, R_2, R_3, R_4, R_5$, and $R_6$ have the same meaning as those in formula (VI), with a haloalkyl vinyl ether (T) represented by the formula $XROCH=CH2$, wherein X represents a halogen atom and R represents an alkylene group having from 1 to 12 carbon atoms.

The compound (S) shown by the formula (XII) can be generally obtained by the reaction of a divalent phenol and a hydroxybenzaldehyde.

Examples of the divalent phenol used in the reaction include resorcinol, 2-methylresorcinol, 5-methylresorcinol, catechol, 3-methylcatechol, hydroquinone, and methylhydroquinone. Examples of the hydroxybenzaldehyde include 2-hydroxybenzaldehyde, 3-hydroxybenzaldehyde, 4-hydroxybenzaldehyde, and 4-hydroxy-3-methylbenzaldehyde.

Examples of the haloalkyl vinyl ether (T) include 2-chloroethyl vinyl ether.

On the reaction of the compound (S) and the compound (T) described above, the reaction rate can be accelerated by adding a proper base as a condensing agent, e.g., anhydrous sodium carbonate; sodium hydride; potassium carbonate; metallic sodium; an alkali metal alcoholate such as sodium methylate, etc.; a quaternary ammonium salt such as triethylbenzylammonium chloride, tetraethylammonium chloride, tributylbenzylammonium chloride, etc.; and a base such as sodium hydroxide, potassium hydroxide, etc., to the reaction system.

In the case of using the base as a condensing agent, its charged amount is generally from 0.1 to 10.0 mols, and preferably from 0.3 to 2.0 mols, per 1.0 mol equivalent of the OH group of the compound (S), so as to obtain a high reaction accelerating effect.

The reaction can be carried out in an inert solvent such as ethyl cellosolve, dimethyl sulfoxide, ethylene glycol monomethyl ether, dimethylacetamide, etc. There is no particular restriction on the reaction temperature but a temperature in the range of from room temperature to 100° C. is preferred.

For isolating and purifying the desired product after finishing the foregoing reaction, any known method can be employed. For example, after cooling the reaction mixture to room temperature, the organic layer is extracted with toluene or methyl isobutyl ketone, the extract is washed several times with water to remove the unreacted compound (S) and inorganic salts, and after drying the organic layer with a drying agent such as anhydrous sodium sulfate, etc., the dried organic layer is concentrated under reduced pressure to provide the desired product. The method is not limited to the above.

Each of the photoresist resin compositions according to the foregoing fourth, fifth, and sixth aspects of the present invention may further comprise a binder polymer having no photosensitive functional group, if necessary. As the binder polymer, a polymer having a good compatibility with the photosensitive resin (each polyfunctional vinyl ether compound) and a photopolymerization initiator, and having a good solubility in an organic solvent, a high strength, and a softening temperature may be suitably selected in various kinds of high molecular materials.

Specific examples of the binder polymer include a (meth) acrylic acid ester polymer, a copolymer of a (meth)acrylic acid ester and (meth)acrylic acid, a styrene-maleic anhydride copolymer, and a reaction product of a styrene-maleic anhydride copolymer and an alcohol. The term "(meth) acrylic" used herein means "acrylic or methacrylic".

The amount of the binder polymer is generally in the range of from 0 to 80% by weight based on the total solid components of the photoresist resin composition.

The photoresist resin composition of the present invention may further comprise a reactive diluent, if necessary. As the reactive diluent, a low-viscous liquid compound having 1 or 2 vinyloxyalkyl groups in the molecule is generally used.

Specific examples of the reactive diluent include ethyl vinyl ether, propyl vinyl ether, isobutyl vinyl ether, octadecyl vinyl ether, vinyl cyclohextl ether, vinyl-4-hydroxy butyl ether, butanediol vinyl ether, triethylene glycol divinyl ether, etc.

The amount of the reactive diluent is generally in the range of from 0 to 70% by weight, and preferably from 0 to 30% by weight, based on the amount of the photopolymerizable monomer.

Examples of the cationic photopolymerization initiator used for the photoresist resin compositions of the present invention include aromatic diazonium salts, aromatic sulfonium salts, aromatic iodonium salts, metallocene compounds, and silicon compound/aluminum complexes.

Specific examples of the cationic Photopolymerization initiator are shown below.

Aromatic sulfonium salt

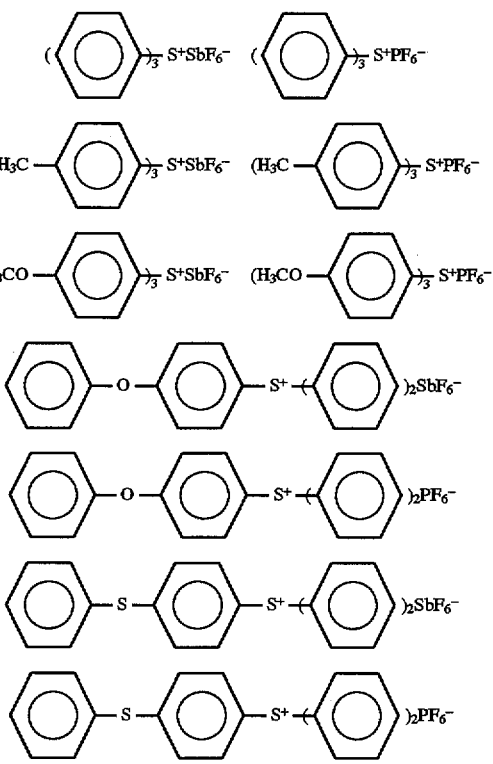

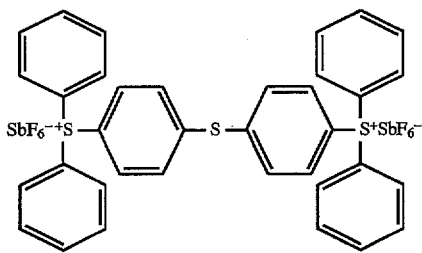

Aromatic iodonium salt

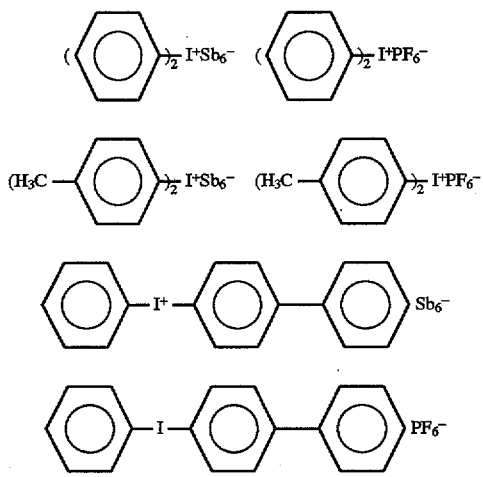

Metallocene compound

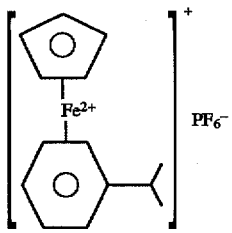

Among the above compounds, the following are preferably used.

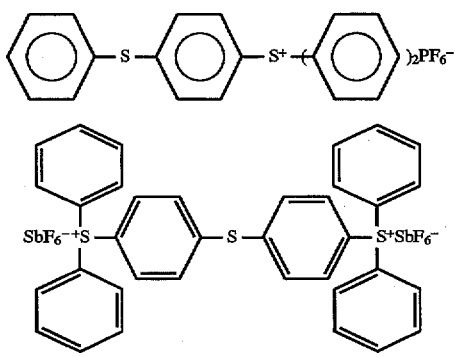

The amount of the cationic photopolymerization initiator is generally in the range of from 0.1 to 20% by weight, and preferably from 1 to 10% by weight, based on the total amount of the photosensitive resin and the reactive diluent.

Examples of the solvent used for the photoresist resin compositions of the present invention include ethylene glycol monoalkyl ethers such as ethylene glycol monomethyl ether, ethylene glycol monoethyl ether, ethylene glycol monopropyl ether, ethylene glycol monobutyl ether, etc.; diethylene glycol dialkyl ethers such as diethylene glycol dimethyl ether, diethylene glycol diethyl ether, diethylene glycol dipropyl ether, diethylene glycol dibutyl ether, etc.; ethylene glycol alkyl acetates such as methyl cellosolve acetate, ethyl cellosolve acetate, etc.; propylene glycol alkylether acetates such as propylene glycol monomethyl ether acetate, propylene glycol monoethyl ether acetate, propylene glycol monopropyl ether acetate, etc.; aromatic hydrocarbons such as benzene, toluene, xylene, etc.; ketones such as methyl ethyl ketone, acetone, methyl isobutyl ketone, cyclohexanone, etc.; alcohols such as ethanol, propanol, butanol, hexanol, cyclohexanol, ethylene glycol, glycerol, etc; and esters such as ethyl lactate, etc. Among these, ethyl cellosolve acetate, propylene glycol monomethyl ether, ethyl lactate, and methyl isobutyl ketone are preferred.

These solvents may be used singly or as a mixture of two or more thereof. The amount of the solvent is preferably from 20 to 2,000% by weight based on the amount of the total solid components.

The photoresist resin composition of the present invention can be used for the production of a color filter by a pigment dispersion method by compounding therewith pigment(s).

Examples of the pigment include inorganic pigments such as barium sulfate, bismuth sulfide, zinc white, lead sulfate, titanium oxide, yellow lead, iron oxide red, ultramarine blue, Prussian blue, chromium oxide, carbon black, etc.; and organic pigments shown as the following color index numbers (C.I.):

C.I. Yellow pigments 20, 24, 86, 93, 109, 110, 117, 125, 137, 138, 139, 147, 148, 153, 154, 166, and 168;
C.I. Orange pigments 36, 43, 51, 55, 59, and 61;
C.I. Red pigments 9, 97, 122, 123, 149, 168, 177, 180, 192, 215, 216, 217, 220, 223, 224, 226, 227, 228, 240, and 48:1;
C.I. Violet pigments 19, 23, 29, 30, 37, 40, and 50;
C.I. Blue pigments 15, 15:6, 22, 60, and 64;
C.I. Green pigments 7 and 36;
C.I. Brown pigments 23, 25, and 26; and
C.I. Black pigment 7.

The amount of the pigment used for the photoresist resin composition of the present invention in the case of producing the color filter is generally from 20 to 80% by weight based on the total solid contents of the composition.

A basic stabilizer can be added to the photoresist resin composition of the present invention, if desired. Examples thereof include tertiary amine compounds such as triethylamine, tributylamine, DBU (diazabicycloundecene), etc.; sodium hydroxide; and potassium hydroxide.

Because the addition of a large amount of the basic stabilizer to the photoresist resin composition of the invention hinders its photosensitivity, the addition amount is generally in the range of from 0.01 to 15% by weight, and preferably not more than 5% by weight, based on the total amount of the photosensitive resin (polyfunctional vinyl ether compound) and the reactive diluent.

Other conventional agents such as a leveling agent may be added to the photoresist resin composition of the present invention for imparting a uniformity on coating the photoresist composition.

The photoresist resin composition of the present invention can be obtained by mixing the components described above, with applying, if necessary, treatments such as a dispersing treatment to the mixture.

In the photoresist resin compositions of the present invention, the photoresist resin composition using the polyfunctional vinyl ether compound shown by formula (VI) described above as the photosensitive resin can be used as either a negative working photoresist resin composition or a positive working photoresist resin composition by controlling the using condition of the cationic photopolymerization initiator, in spite of the photoresist resin composition uses the same photosensitive resin. Furthermore, in both the cases of the resist characteristics, the photoresist resin compositions have excellent sensitivity and resolution.

As photosensitive resins for conventional photoresist resin compositions, it is general that different photosensitive resins are used according to the difference of the resist characteristics of a negative working type or a positive working type. Accordingly, in the conventional case of using a negative working photoresist and a positive working photoresist in a single production line, it is very inconvenient, because production conditions, such as the coating conditions of the resin on a substrate, the hardening conditions of the resin including pre-baking, post exposure baking and post hardening after development, and the development condition, must be greatly changed.

The photoresist resin composition of the present invention avoids such an inconvenience.

The mechanisms in that the photoresist resin composition using the polyfunctional vinyl ether compound represented by formula (VI) described above as the photosensitive resin can show both the negative working characteristics and the positive working characteristics depend on the kind and the amount of the cationic polymerization initiator used.

When a Lewis acid generating compound such as a metallocene compound is used as the cationic photopolymerization initiator or when a protonic acid generating compound such as an aromatic sulfonium salt compound is used as the cationic photopolymerization initiator in an amount of not more than 1% by weight based on the total amount of the photosensitive resin and the reactive diluent, the photoresist resin composition shows the negative working characteristics where only the exposed portions are hardened.

When a protonic acid generating compound is used as the cationic photopolymerization initiator in an amount of at least 5% by weight based on the total amount of the photosensitive resin and the reactive diluent, that is, when a large amount of proton exists in the hardening system, the light-exposed portions of the photoresist resin composition are dissolved in a developer solution, and the photoresist resin composition shows the positive working characteristics where only the unexposed portions are hardened. It is considered that in the exposed portions, the polymerization reaction is restrained due to the occurrence of the acid hydrolysis reaction of the vinyl oxyalkyl group and in the unexposed portions, the polymerization reaction of the vinyloxyalkyl group preferentially occurs by heating at post exposure baking.

The photoresist resin composition of the present invention can be used for a photolithography. For example, when the photoresist resin composition is compounded with a proper pigment, it can be used for producing a color filter (one or both of the color portions and the black matrix portions) for a liquid crystal displaying apparatus utilizing the pattern formation by a photolithography.

The photolithography using the photoresist resin composition of the present invention can be carried out, for example, as follows:

The resist liquid is spin-coated on a substrate followed by heat-drying (pre-baking) to form a smooth coated layer.

The coated layer thus obtained was irradiated with ultraviolet rays through a negative mask or a positive mask for forming a desired image. For uniformly irradiating the whole the coated layer with parallel ultraviolet rays, it is preferred to use an appropriate apparatus such as a mask alignment.

The irradiated coated layer is then post hardened (post exposure baking) by heating the layer to a temperature of from 60° to 120° C. for from 1 to 60 minutes.

The coated layer post hardened is immersed in a diluted aqueous alkali solution to dissolve the unhardened portions, whereby the desired image is developed.

After development, the imaged layer may be further post hardened at a temperature of from about 100° to 250° C. and for from about 5 to 20 minutes.

The present invention is described in more detail by the following examples but the invention is not construed as being limited by these examples.

EXAMPLE 1

33.0 g of a resorcinol-novolac resin (OH equivalent: 59) obtained by the condensation reaction of resorcinol and formalin and 100 g of dimethyl sulfoxide were placed in a reaction vessel equipped with a reflux condenser, a thermometer, a stirrer, and a nitrogen gas introducing means, and the resin was dissolved. 31.9 g of powdery sodium hydroxide was added to the resulting solution, followed by stirring for 30 minutes at 60° C. 24.7 g of 2-chloroethyl vinyl ether was added dropwise to the mixture over a period of one hour while keeping the inside temperature of the reaction vessel at 60° C., and the mixture was kept at 60° C. for 4 hours to finish the reaction.

After neutralizing excessive sodium hydroxide with 20.0 g of a 10% aqueous solution of phosphoric acid, 300.0 g of methyl isobutyl ketone and 150.0 g of water were added to the reaction mixture, whereby the desired product was extracted into the organic layer and inorganic salts were dissolved in the aqueous layer.

Thereafter, the organic layer was collected, washed 5 times each with 200.0 g of a 20% aqueous solution of sodium chloride, dried with anhydrous sodium sulfate, and filtered. Then, methyl isobutyl ketone was distilled off from the organic layer under reduced pressure to provide 53.0 g of the desired product.

From the infrared absorption spectra of the product, the absorptions based on a vinyl group were observed at 1610 $cm^{-1}$ and 975 $cm^{-1}$ and the absorption based on an ether bond was observed at 1200 $cm^{-1}$. The vinyl ether substituted ratio was calculated from the result of determination of the residual phenolic hydroxy group by a neutralization titration method and was found to be 50%.

The compound obtained was a polyfunctional vinyl ether compound shown by formula (I) described above, wherein $R_1$ and $R_2$ each was a hydrogen atom, A was a methylene group, Q was composed of —OH and —$CO_2H_4OCH=CH_2$ at a molar ratio (—OH)/(—$CO_2H_4OCH=CH_2$) of 50/50, and n was 3.

EXAMPLE 2

10.0 g of a methylhydroquinone-novolac resin (OH equivalent: 65) obtained by the condensation reaction of methylhydroquinone and formalin and 50.0 g of dimethyl sulfoxide were placed in a reaction vessel equipped with a reflux condenser, a thermometer, a stirrer, and a nitrogen gas introducing means, and the resin was dissolved, 3.3 g of powdery sodium hydroxide was added to the resulting solution followed by stirring for 30 minutes at 60° C. 16.7 g of 2-chloroethyl vinyl ether was added dropwise to the mixture over a period of one hour while keeping the inside temperature of the reaction vessel at 60° C. and the mixture was kept at 60° C. for 4 hours to finish the reaction.

After neutralizing excessive sodium hydroxide in the reaction mixture thus obtained with 5.0 g of a 10% aqueous solution of phosphoric acid, 300.0 g of methyl isobutyl ketone and 200.0 g of water were added to the reaction mixture, whereby the desired product was extracted into the organic layer and inorganic salts were dissolved in the aqueous layer.

Thereafter, the organic layer was collected, washed 5 times each with 100.0 g of a 20% aqueous solution of sodium chloride, dried with anhydrous sodium sulfate, and filtered. Then, methyl isobutyl ketone was distilled off from the organic layer under reduced pressure to provide 10.0 g of the desired product.

From the infrared absorption spectra of the product, the absorptions based on a vinyl group were observed at 1610 $cm^{-1}$ and 975 $cm^{-1}$ and the absorption based on an ether bond was observed at 1200 $cm^{-1}$. The vinyl ether substituted ratio was calculated from the result of determination of the residual phenolic hydroxy group by a neutralization titration method and was found to be 30%.

The compound obtained was a polyfuctional vinyl ether compound shown by the formula (I) described above, wherein $R_1$ was a hydrogen atom, $R_2$ was a methyl group, A was a methylene group, Q was composed of —OH and —$CO_2H_4OCH=CH_2$ at a molar ratio (—OH)/(—$CO_2H_4OCH=CH_2$) of 70/30, and n was 0.

EXAMPLE 3

37.5 g of a novolac resin (Sumikanol 620, trade name, made by Sumutomo Chemical Company, Limited, OH equivalent: 75) obtained by the condensation reaction of p-cresol, p-t-octyl phenol, resorcinol and formalin and 187.5 g of dimethyl sulfoxide were placed in a reaction vessel equipped with a reflux condenser, a thermometer, a stirrer, and a nitrogen gas introducing means, and the resin was dissolved, 12.0 g of powdery sodium hydroxide was added to the resulting solution followed by stirring for 30 minutes at 60° C. 38.4 g of 2-chloroethyl vinyl ether was added dropwise to the mixture over a period of one hour while keeping the inside temperature of the reaction vessel at 60° C., and the mixture was kept at 60° C. for 6 hours to finish the reaction.

After neutralizing excessive sodium hydroxide in the reaction mixture thus obtained with 3.0 g of a 10% aqueous solution of phosphoric acid, 450.0 g of methyl isobutyl ketone and 400.0 g of water were added to the reaction mixture, whereby the desired product was extracted into the organic layer and inorganic salts were dissolved in the aqueous layer.

Thereafter, the organic layer was collected, washed 5 times each with 400.0 g of a 20% aqueous solution of sodium chloride, dried with anhydrous sodium sulfate, and filtered. Then, methyl isobutyl ketone was distilled off from the organic layer under reduced pressure to provide 52.7 g of the desired product.

From the infrared absorption spectra of the product, the absorptions based on a vinyl group were observed at 1610 $cm^{-1}$ and 975 $cm^{-1}$ and the absorption based on a ether bond was observed at 1200 $cm^{-1}$. The vinyl ether substituted ratio was calculated from the result of determination of the residual phenolic hydroxy group by a neutralization titration method and was found to be 60%.

The compound obtained was a polyfunctional vinyl ether compound shown by the following formula:

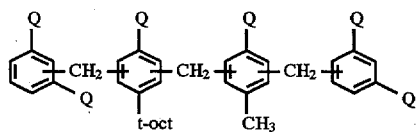

wherein Q was composed of —OH and —$OCH_2CH_2OCH=CH_2$ at a molar ratio (—OH)/(—$OCH_2CH_2OCH=CH_2$) of 40/60. In the formula, t-oct represents a t-octyl group.

EXAMPLE 4

22.3 g of a catechol-novolac resin (OH equivalent: 58.4) obtained by the condensation reaction of catechol and formalin and 50 g of dimethyl sulfoxide were placed in a reaction vessel equipped with a reflux condenser, a thermometer, a stirrer, and a nitrogen gas introducing means, and the resin was dissolved 8.8 g of powdery sodium hydroxide was added to the resulting solution, followed by stirring for 30 minutes at 60° C. 22.5 g of 2-chloroethyl vinyl ether was added dropwise to the mixture over a period of one hour while keeping the inside temperature of the reaction vessel at 60° C., and the mixture was kept at 100° C. for 5 hours to finish the reaction.

After neutralizing excessive sodium hydroxide with 4.0 g of a 10% aqueous solution of phosphoric acid, 50.0 g of methyl isobutyl ketone and 100.0 g of water were added to the reaction mixture, whereby the desired product was extracted into the organic layer and inorganic salts were dissolved in the aqueous layer.

Thereafter, the organic layer was collected, washed 5 times each with 100.0 g of a 20% aqueous solution of sodium chloride, dried with anhydrous sodium sulfate, and filtered. Then, methyl isobutyl ketone was distilled off from the organic layer under reduced pressure to provide 32.8 g of the desired product.

From the infrared absorption spectra of the product, the absorptions based on a vinyl group were observed at 1610 $cm^{-1}$ and 975 $cm^{-1}$ and the absorption based on an ether bond was observed at 1200 $cm^{-1}$. The vinyl ether substituted ratio was calculated from the result of determination of the residual phenolic hydroxy group by a neutralization titration method and was found to be 55%.

The compound obtained was a polyfunctional vinyl ether compound shown by the following formula:

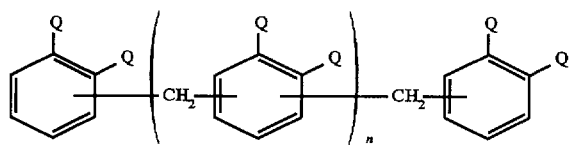

wherein n was 3, and Q, was composed of —OH and —OCH$_2$CH$_2$OCH=CH$_2$ at a molar ratio (—OH)/(—OCH$_2$CH$_2$CH=CH$_2$) 45/55.

EXAMPLE 5

58.2 g of a novolac resin (OH equivalent: 72.7) obtained by the condensation reaction of 2-methylresolcinol and 4-hydroxybenzaldehyde and 152.0 g of dimethyl sulfoxide were placed in a reaction vessel equipped with a reflux condenser, a thermometer, a stirrer, and a nitrogen gas introducing means, and the resin was dissolved. 16.7 g of powdery sodium hydroxide and 7.7 g of tetrabutylammonium bromide were added to the resulting solution followed by stirring for 30 minutes at 60° C. 51.2 g of 2-chloroethyl vinyl ether was added dropwise to the mixture over a period of 20 minutes while keeping the inside temperature of the reaction vessel at 60° C., and the resultant mixture was kept at 70° C. for 6 hours to finish the reaction.

After neutralizing excessive sodium hydroxide in the reaction mixture with 6.0 g of an 85% aqueous solution of phosphoric acid, 250.0 g of methyl isobutyl ketone and 400.0 g of water were added to the reaction mixture, whereby the desired product produced was extracted into the organic layer and inorganic salts were dissolved in the aqueous layer.

Thereafter, the organic layer was collected, washed 5 times each with 400.0 g of water, dried with anhydrous sodium sulfate, and filtered. Then, methyl isobutyl ketone was distilled off from the organic layer under reduced pressure to provide 80.4 g of the desired product.

From the infrared absorption spectra of the product obtained, the absorptions based on a vinyl group were observed at 1610 cm$^{-1}$ and 975 cm$^{-1}$ and the absorption based on an ether bond was observed at 1200 cm$^{-1}$ the vinyl ether substituted ratio was calculated from the result of determination of the residual phenolic hydroxy group by a neutralization titration method and was found to be 50%.

The compound obtained was a polyfunctional vinyl ether compound shown by the following formula:

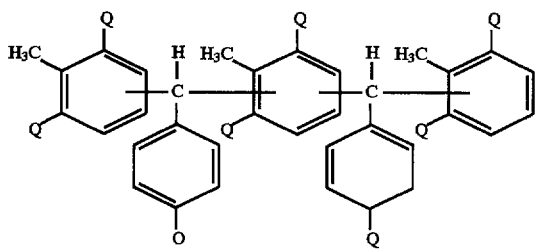

wherein Q was composed of —OH and —OCH$_2$CH2OCH=CH$_2$ at a molar ratio (—OH)/(—OCH$_2$CH$_2$OCH=CH$_2$) of 50/50.

EXAMPLE 6

34.5 g of a novolac resin (OH equivalent: 69.0) obtained by the condensation reaction of catechol and 4-hydroxybenzaldehyde and 50.0 g of dimethyl sulfoxide were plated in a reaction vessel equipped with a reflux condenser, a thermometer, a stirrer, and a nitrogen gas introducing means and the resin was dissolved. 12.0 g of powdery sodium hydroxide and 2.0 g of tetrabutylammonium bromide were added to the resulting solution followed by stirring for 30 minutes at 60° C. 31.8 g of 2-chloroethyl vinyl ether was added dropwise to the mixture over a period of 20 minutes while keeping the inside temperature of the reaction vessel at 60° C., and the mixture was kept at 80° C. for 6 hours to finish the reaction.

After neutralizing excessive sodium hydroxide in the reaction mixture with 0.2 g of an 85% aqueous solution of phosphoric acid, 300.0 g of methyl isobutyl ketone and 150.0 g of water were added to the reaction mixture, whereby the desired product produced was extracted into the organic layer and inorganic salts were dissolved in the aqueous layer.

Thereafter, the organic layer was collected, washed 5 times each with 150.0 g of water, dried with anhydrous sodium sulfate, and filtered. Then, methyl isobutyl ketone was distilled off from the organic layer under reduced pressure to provide 52.5 g of the desired product.

From the infrared absorption spectra of the product obtained, the absorptions based on a vinyl group were observed at 1610 cm$^{-1}$ and 975 cm$^{-1}$ and the absorption based on an ether bond was observed at 1200 cm$^{-1}$. The vinyl ether substituted ratio was calculated from the result of determination of the residual phenolic hydroxy group by a neutralization titration method and was found to be 60%.

The compound obtained was a polyfunctional vinyl ether compound shown by the following formula:

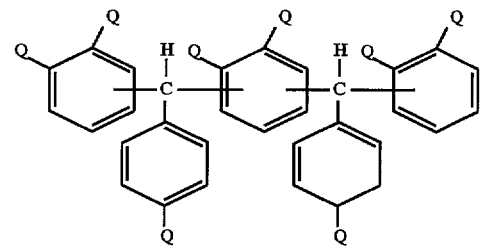

wherein Q was composed of —OH and —OCH$_2$CH$_2$OCH=CH$_2$ at a molar ratio (—OH)/(—OCH$_2$CH$_2$OCH=CH$_2$) of 40/60.

EXAMPLES 7 TO 10

Preparation of Photoresist Composition

Photoresist compositions were prepared by compounding the components shown in Table 1 below. The unit of the numerals in the table was parts by weight.

TABLE 1

| Component | Example 7 | Example 8 | Example 9 | Example 10 |
|---|---|---|---|---|
| Photoresist Resin 1 | 20 | 15 | — | — |
| Photoresist Resin 2 | — | — | 20 | — |
| Photoresist Resin 3 | — | — | — | 20 |
| Reactive Diluent 1 | — | 5 | — | — |
| FX-512 | 1.2 | 1.2 | 1.2 | 1.2 |
| Ethylcellosolve Acetate | 80 | 80 | 80 | 80 |

The compounds shown Table 1 above are as follows:

Photosensitive Resin 1:
The compound shown by the following formula:

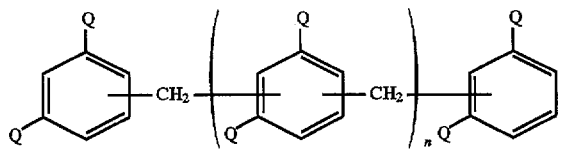

n: 2 to 3
Q: (—OH)/(—OCH$_2$CH$_2$OCH=CH$_2$) =50/50 (molar ratio)

Photosensitive Resin 2:
The compound shown by the following formula:

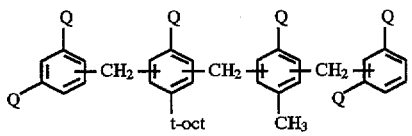

Q: (—OH)/(—OCH$_2$CH$_2$OCH=CH$_2$)=40/60(molar ratio)
t-oct: t-octyl group photosensitive Resin 3:
The compound shown by the following formula:

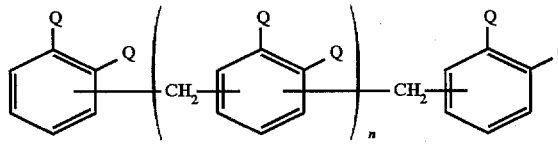

n: 3
Q: (—OH)/(—OCH$_2$CH$_2$OCH=CH$_2$)=45/55 (molar ratio)

Reactive Diluent 1:
Triethylene glycol divinyl ether

FX-512:
Trade name, made by 3M Company; Cationic photopolymerization initiator.

Each composition shown in Table 1 was filtered under pressure using a membrane filter (mesh: 1 μm) to prepare negative working photoresist resin compositions.

Evaluation:
A glass plate as a transparent substrate was washed with a neutral detergent, water, and then an alcohol, followed by drying.

Each photoresist composition shown in Table 1 was coated on the glass substrate by spin coating at 1,000 to 2,000 r.p.m. and pre-baked at 60° C. for 5 minutes.

The coated layer was then subjected to a patternwise exposure by a light exposure means, KASPER 2001 (trade name, manufactured by KASPER Co.). In the case where the photoresist composition of Comparative Example 1 was exposed, oxygen was intercepted by using a nitrogen gas flow.

Thereafter, the exposed layer was subjected to post exposure baking for 10 minutes at 80° C. and developed by treating the layer with a 3% aqueous solution of sodium hydroxide for 30 seconds at 25° C.

The layer thickness was adjusted such that the thickness became from 1 to 1.5 μm after exposure and development.

The results are shown in Table 2 below.

In Table 2, the term "sensitivity" means the lowest light exposure energy amount for forming residual layers on the substrate after development. A smaller value shows a higher sensitivity.

The "resolution" was measured using a figure (line & space) wherein several lines were arranged with the same interval as the width of the line. A set of several figures in which the line width of each figure was changed was used as a mask, the pattern thereof was printed on the resist layer formed on the substrate, and the resolution limit was shown in terms of the minimum line width (μm) that could be reproduced.

TABLE 2

|  | Oxygen interception | Sensitivity (mJ/sq · cm) | Resolution (μm) |
|---|---|---|---|
| Example 7 | none | 10 | 10 |
| Example 8 | none | 10 | 10 |
| Example 9 | none | 50 | 10 |
| Example 10 | none | 50 | 10 |

In Examples 7 to 10, each resist layer could be hardened without applying an oxygen interception by a nitrogen gas flow at light hardening and the evaluation results of the sensitivity and the resolution were good as a photoresist.

EXAMPLES 11 TO 14

Preparation of Photoresist Composition

Photoresist compositions were prepared by compounding the components shown in Table 3 below. The unit of the numerals in the table was parts by weight.

TABLE 3

| Component | Example 11 | Example 12 | Example 13 | Example 14 |
|---|---|---|---|---|
| Photosensitive Resin 1 | 20 | 20 | — | — |
| Photosensitive Resin 2 | — | — | 20 | 20 |
| IRUGACURE 261 | 1.2 | — | 1.2 | — |
| FX-512 | — | 1.2 | — | 1.2 |
| Ethylcellosolve Acetate | 80 | 80 | 80 | 80 |

The compounds shown in Table 3 above are as follows:

Photosensitive Resin 1:

The compound shown by the following formula:

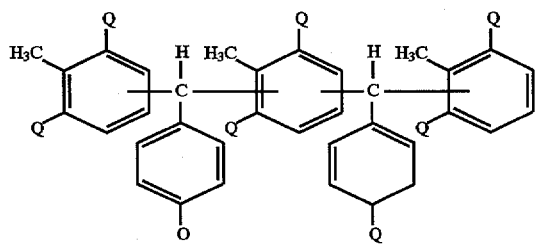

Q: (—OH)/(—OCH$_2$CH$_{20}$CH=CH$_2$)=50/50 (molar ratio)

Photosensitive Resin 2:
The compound shown by the following formula:

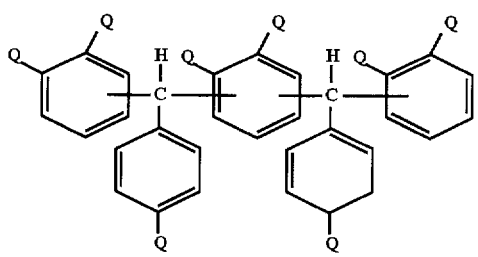

Q: (—OH)/(—OCH$_2$CH$_2$OCH=CH$_2$)=40/60 (molar ratio)

IRUGACURE 261:

Trade name, made by Ciba-Geigy Corporation, cationic photopolymerization initiator (Lewis acid generation type) FX-512:

Trade name, made by 3M Company, cationic photopolymerization initiator (protonic acid generating type)

Each composition shown in Table 3 was filtered under pressure using a membrane filter (mesh: 1 μm) to prepare negative working photoresist resin compositions.

Evaluation

A glass plate as a transparent substrate was washed with a neutral detergent, water, and then an alcohol, followed by drying.

Each photoresist composition shown in Table 3 was coated on the glass substrate by spin coating at 1,000 to 2,000 r.p.m. and pre-baked at 60° C. for 20 minutes.

The coated layer was then subjected to a patternwise exposure by a light exposure means KASPER 2001 (trade name, manufactured by KASPER Co.).

Thereafter, the exposed layer was subjected to post exposure baking at 100° C. for 10 minutes and developed by treating the layer with a 3% aqueous solution of sodium hydroxide for 30 seconds at 25° C.

The layer thickness was adjusted such that the thickness became from 1 to 1.5 μm after light exposure and the development.

The results obtained are shown in Table 4 below.

The meanings of the terms "sensitivity" and "resolution" are the same as those in Table 2.

TABLE 4

|  | Oxygen Interception | Photoresist Characteristics | Sensitivity (mJ/sq · cm) | Resolution (μM) |
|---|---|---|---|---|
| Example 11 | none | negative | 10 | 3 |
| Example 12 | none | positive | 100 | 3 |
| Example 13 | none | negative | 20 | 3 |
| Example 14 | none | positive | 100 | 3 |

In Examples 11 to 14, each layer could be hardened without using an oxygen interception by a nitrogen gas flow at light hardening and the evaluation results of the sensitivity and the resolution were good as a photoresist.

It is understood from the comparison between Examples 11 and 12 and the comparison between Examples 13 and 14 that the same photosensitive resin could be used for both negative resist characteristics and positive resist characteristics by changing the kind of the cationic photopolymerization initiator.

As described above, by using the photoresist resin composition of the present invention in photolithography, the oxygen interception by a nitrogen gas flow, etc., at light hardening becomes unnecessary, whereby handling of the resist resin at the use thereof becomes very easy. The photoresist resin composition of the present invention exhibits excellent performance as a photoresist such as a high sensitivity, a high resolution, and developability with an aqueous diluted alkali solution.

Furthermore, by using the photoresist resin composition using the polyfunctional vinyl ether compound shown by formula (VI) described above, the same photoresist resin can be used for both a negative working photoresist composition and a positive working photoresist composition by controlling the kind and the amount of the cationic photopolymerization initiator used.

While the invention has been described in detail and with reference to specific examples thereof, it will be apparent to one skilled in the art that various changes and modifications can be made therein without departing from the spirit and scope thereof.

What is claimed is:

1. A negative working photoresist resin composition comprising:

(1) at least one polyfunctional vinyl ether compound represented by formula (I):

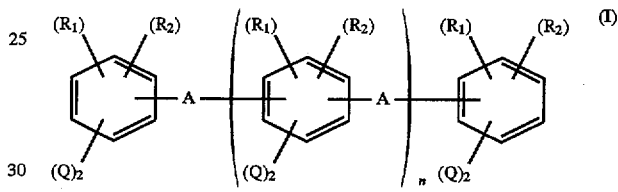

wherein n, which is an average repeating number, represents a number of from 0 to 20; $R_1$ and $R_2$ each independently represents a hydrogen atom, a halogen atom, an alkyl group, an aryl group, an aralkyl group, an alkoxy group, an aryloxy group, or a cycloalkyl group; Q each independently represents —OH or a group shown by the formula —OROCH=CH$_2$, wherein R represents an alkylene group having from 1 to 12 carbon atoms, the molar ratio of (—OH)/(—OROCH=CH$_2$) being from 30/70 to 70/30 and A each independently represents a divalent hydrocarbon group having from 1 to 30 carbon atoms, (2) at least one kind of a cationic photopolymerization initiator, and (3) a solvent.

2. The negative working photoresist resin composition of claim 1 wherein n represents a number from 0 to 10.

3. The negative working photoresist resin composition of claim 1, wherein $R_1$ and $R_2$ each independently represents a hydrogen atom, a fluorine atom, a chlorine atom, a bromine atom, a methyl group, an ethyl group, a propyl group, a butyl group, an octyl group, a phenyl group, a tolyl group, a naphthyl group, a phenethyl group, a benzhydryl group, an ethoxy group, a propoxy group, a phenoxy group, a naphthoxy group, an anthroxy group, a cyclopentyl group or an cyclohexyl group.

4. The negative working photoresist resin composition of claim 1, wherein $R_1$ and $R_2$ each independently represents a hydrogen atom, a methyl group, a t-butyl group, a t-octyl group, or a bromine atom.

5. The negative working photoresist resin composition of claim 1, wherein A each independently represents an alkylene group, a cycloalkylene group, an arylene group or a group having a cyclic terpene skeleton.

6. The negative working photoresist resin composition of claim 5, wherein A each independently represents a methylene group, an ethylene group, an isopropylidene group, a butylene group, an ethylmethylene group, a 2-ethylpentylmethylene group, a cyclohexylidene group, a cyclooctylidene group, a dicyclopentylene group, a 1,3-benzenedimethylene group, a phenylmethylene group, a 1,4-benzenedimethylene group, a 2,2-bis(4-phenylene) propane group, a 4-methoxyphenylmethylene group, a bis (4-phenylene)methane group, a 4,4-diphenyldimethylethane group, a limonene group, a dipentyne group, a terpinolene group or a pinene group.

7. The negative working photoresist resin composition of claim 6, wherein A each independently represents a methylene group, an isopropylidene group, a cyclohexylidene group or a dicyclopentylene group.

8. A negative working photoresist resin composition comprising:

(1) at least one polyfunctional vinyl ether compound represented by formula (I):

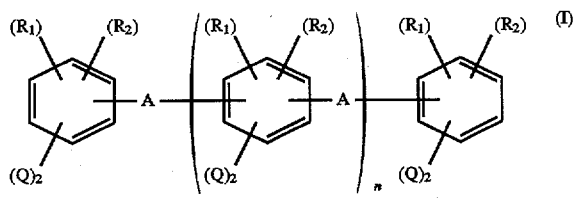

wherein n, which is an average repeating number, represents a number of from 0 to 20; $R_1$ and $R_2$ each independently represents a hydrogen atom, a halogen atom, an alkyl group, an aryl group, an aralkyl group, an alkoxy group, an aryloxy group, or a cycloalkyl group; Q each independently represents —OH or a group shown by the formula —OROCH=$CH_2$, wherein R represents an alkylene group having from 1 to 12 carbon atoms, the molar ratio of (—OH)/(—OROCH=$CH_2$ being from 30/70 to 70/30; and A each independently represents a divalent hydrocarbon group having from 1 to 30 carbon atoms, wherein from 0.1 to 60 mol % of each of the groups represented by formulae (II) and (III) in formula (I):

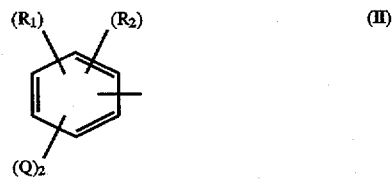

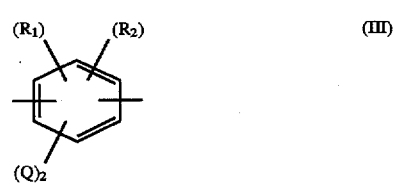

wherein $R_1$, $P_2$, and Q have the same meaning as those in formula (I), is replaced with each of the groups represented by (IV) and (V), respectively:

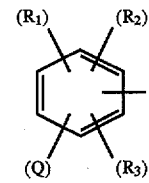

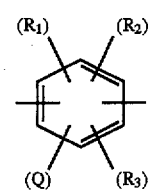

wherein $R_1$, $R_2$, and Q have the same meaning as those in the formula (I); and $R_3$ has the same meaning as $R_1$ and $R_2$;

(2) at least one kind of cationic photopolymerization initiator, and (3) a solvent.

9. The negative photoresist resin composition of claim 8, wherein $R_1$ and $R_2$ each independently represents a hydrogen atom, a fluorine atom, a chlorine atom, a bromine atom, a methyl group, an ethyl group, a propyl group, a butyl group, an octyl group, a phenyl group, a tolyl group, a naphthyl group, a phenethyl group, a benzhydryl group, an ethoxy group, a propoxy group, a phenoxy group, a naphthoxy group, an anthroxy group, a cyclopentyl group or an cyclohexyl group.

10. The negative working photoresist resin composition of claim 9, wherein $R_1$ and $R_2$ each independently represents a hydrogen atom, a methyl group, a t-butyl group, a t-octyl group, or a bromine atom.

11. The negative working photoresist resin composition of claim 8, wherein A each independently represents an alkylene group, a cycloalkylene group, an arylene group or a group having a cyclic terpene skeleton.

12. The negative working photoresist resin composition of claim 11, wherein A each independently represents a methylene group, an ethylene group, an isopropylidene group, a butylene group, an ethylmethylene group, a 2-ethylpentylmethylene group, a cyclohexylidene group, a cyclooctylidene group, a dicyclopentylene group, a 1,3-benzenedimethylene group, a phenylmethylene group, a 1,4-benzenedimethylene group, a 2,2-bis(4-phenylene) propane group, a 4-methoxyphenylmethylene group, a bis (4-phenylene)methane group, a 4,4-diphenyldimethylethane group, a limonene group, a dipentyne group, a terpinolene group or a pinene group.

13. The negative working photoresist resin composition of claim 12, wherein A each independently represents a methylene group, an isopropylidene group, a cyclohexylidene group or a dicyclopentylene group.

14. A photoresist resin composition fundamentally comprising:

(1) at least one polyfunctional vinyl ether compound represented by formula (VI):

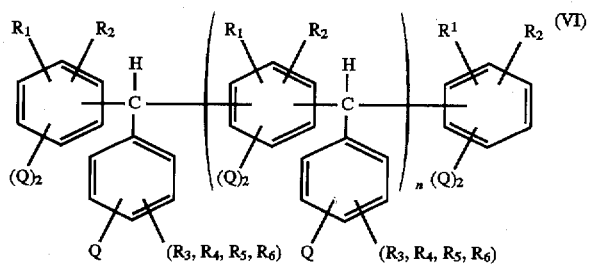

wherein n, which is an average repeating number, represents a number of from 0 to 20; $R_1$, $R_2$, $R_3$, $R_4$, $R_5$, and $R_6$ each independently represents a hydrogen atom, a halogen atom, an alkyl group, an aryl group, an aralkyl group, an alkoxy group, an aryloxy group, or a cycloalkyl group, where each of $R_3$, $R_4$, $R_5$, and $R_6$ is bonded to the benzene nucleus; and Q each independently represents —OH or a group represented by the formula —OROCH=CH$_2$, wherein R represents an alkylene group having from 1 to 12 carbon atoms, the molar ratio of (—OH)/(—OROCH=CH$_2$) being from 30/70 to 70/30, (2) at least one kind of a cationic photopolymerization initiator, and (3) a solvent.

15. A photoresist resin composition as claimed in claim 14, wherein said photoresist resin composition is a negative working photoresist resin composition, and said cationic photopolymerization initiator is an aromatic sulfonium salt that is used in an amount of not more than 1% by weight based on the amount of said polyfunctional vinyl ether compound.

16. A photoresist resin composition as claimed in claim 14, wherein said photoresist resin composition is a positive working photoresist resin composition, and said cationic photopolymerization initiator is an aromatic sulfonium salt that is used in an amount of at least 5% by weight based on the amount of said polyfunctional vinyl ether compound.

17. The negative working photoresist resin composition of claim 14, wherein n represents a number from 0 to 10.

18. The negative working photoresist resin composition of claim 14, wherein $R_1$, $R_2$, $R_3$, $R_4$, $R_5$ and $R_6$ each independently represents a hydrogen, a fluorine atom, a chlorine atom, a bromine atom, a methyl group, an ethyl group, a propyl group, a butyl group, a phenyl group, a tolyl group, a naphthyl group, a benzyl group, a phenethyl group, a benzhydryl group, a methoxy group, a ethoxy group, a propoxy group, a phenoxy group, a naphthoxy group an anthroxy group, a cyclopentyl group or a cyclohexyl group.

* * * * *